(12) United States Patent
Vyshnevskyy et al.

(10) Patent No.: US 7,218,031 B2
(45) Date of Patent: May 15, 2007

(54) METHOD FOR OPERATING A PIEZOELECTRIC MOTOR, AND PIEZOELECTRIC MOTOR COMPRISING A STATOR IN THE FORM OF A HOLLOW-CYLINDRICAL OSCILLATOR

(75) Inventors: Oleksiy Vyshnevskyy, Woerth (DE); Wladimir Wischnewskiy, Waldbronn (DE)

(73) Assignee: Physik Instrumente (PI) GmbH & Co. KG, Karlsruhe (DE)

( * ) Notice: Subject to any disclaimer, the term of this patent is extended or adjusted under 35 U.S.C. 154(b) by 106 days.

(21) Appl. No.: 10/541,305

(22) PCT Filed: Dec. 11, 2003

(86) PCT No.: PCT/EP03/14077

§ 371 (c)(1),
(2), (4) Date: Jul. 5, 2005

(87) PCT Pub. No.: WO2004/064170

PCT Pub. Date: Jul. 29, 2004

(65) Prior Publication Data

US 2006/0145572 A1    Jul. 6, 2006

(30) Foreign Application Priority Data

Jan. 8, 2003   (DE) ................. 103 00 266
Apr. 1, 2003   (DE) ................. 103 14 810

(51) Int. Cl.
*H01L 41/08* (2006.01)
(52) U.S. Cl. ................. 310/323.02; 310/369
(58) Field of Classification Search .......... 310/323.02, 310/323.04, 323.05, 323.06, 366, 369
See application file for complete search history.

(56) References Cited

U.S. PATENT DOCUMENTS 4,087,715 A * 5/1978 Myer ................. 310/317
4,678,956 A * 7/1987 Izukawa et al. ....... 310/323.06

(Continued)

FOREIGN PATENT DOCUMENTS

| DE | 195 22 072 | 2/1997 |
|----|------------|--------|
| EP | 0 793 282  | 9/1997 |
| EP | 1 061 638  | 12/2000 |
| JP | 63-167683  | 7/1988 |
| JP | 03-040765  | 2/1991 |

*Primary Examiner*—Mark Budd
(74) *Attorney, Agent, or Firm*—Oblon, Spivak, McClelland, Maier & Neustadt, P.C.

(57) ABSTRACT

The invention relates to a method for operating a piezoelectric motor having a stator in the form of a hollow-cylindrical oscillator, the at least one front side of which has frictional contact with a rotor and which comprises standing wave generators. According to the invention the hollow cylinder is set into a coupled tangential-axial oscillation mode so that the cylinder mainly has tangential and axial oscillatory components. The oscillatory speed maximums of the tangential components are formed on the front sides of the hollow cylinder and those of the axial components directly underneath thereof, wherein the components decrease towards the center of the cylinder height and, in the center of the cylinder height, substantially parallel to the front sides, a nodal line is formed on which the axial oscillatory component adopts the value zero and the tangential components adopt a minimum. With a motor operated in such a manner the kinetic drive energy for the rotor is concentrated in the proximity of the front sides of the hollow cylinder, wherein a mechanical attachment for the motor can be arranged in the central portion on the zero line of the oscillatory speed components.

11 Claims, 17 Drawing Sheets

U.S. PATENT DOCUMENTS 4,893,047 A * 1/1990 Honda .................. 310/323.02
4,894,578 A * 1/1990 Honda .................. 310/323.02
5,323,082 A * 6/1994 Wright ...................... 310/328
5,872,418 A * 2/1999 Wischnewskiy ....... 310/323.06
6,194,813 B1 * 2/2001 Israelachvili ................ 310/328

* cited by examiner

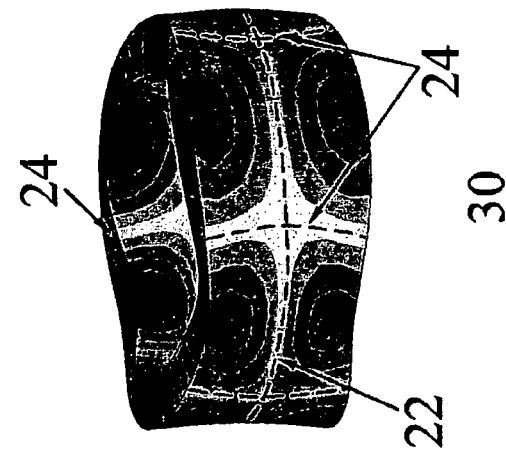
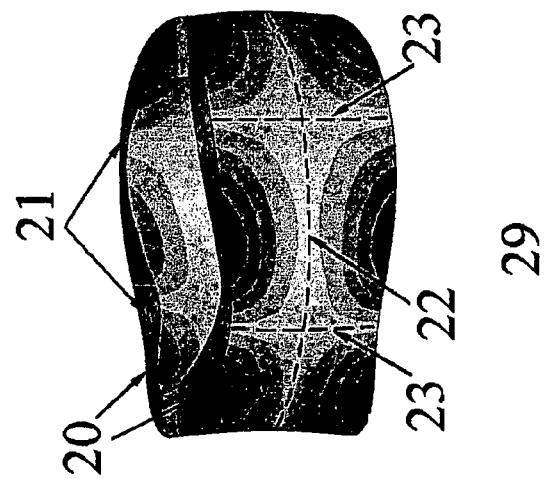
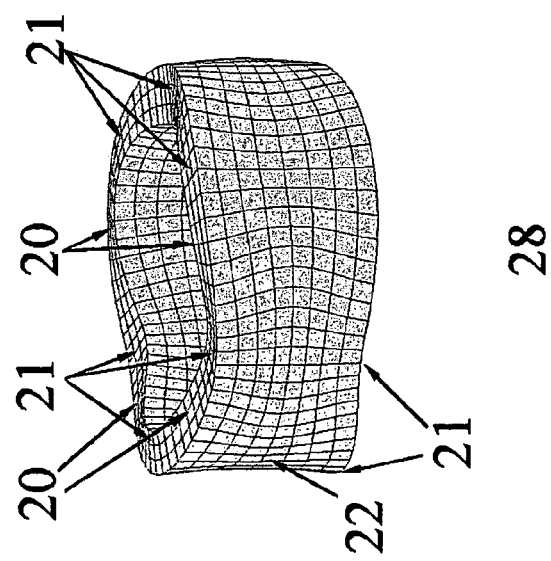
Fig.7

METHOD FOR OPERATING A PIEZOELECTRIC MOTOR, AND PIEZOELECTRIC MOTOR COMPRISING A STATOR IN THE FORM OF A HOLLOW-CYLINDRICAL OSCILLATOR

The invention relates to a method for operating a piezoelectric motor having a stator in the form of a hollow-cylindrical oscillator, the at least one front side of which has frictional contact with a rotor and which comprises standing wave generators, according to the preamble of claim 1, to a piezoelectric motor having a stator in the form of a hollow-cylindrical oscillator, the at least one front side of which has frictional contact with a rotor and which comprises standing wave generators, according to the preamble of patent claim 3.

Piezoelectric ultrasonic motors are known from U.S. Pat. No. 5,654,604, the operating mode of which is based on the excitation of thin metallic resonators in which bending waves are generated.

For the excitation of bending waves with such motors, a thin piezoelectric disc is affixed to a metallic resonator, preferably by gluing. Due to the different thermal expansion coefficients of the piezoelectric disc, on the one hand, and of the metallic resonator, on the other hand, it is an essential drawback of these motors that it is more or less impossible to obtain a rigid connection. Therefore, such a connection is produced by means of epoxy resin adhesives having a certain residual elasticity so as to compensate the differences in the expansion coefficients. Such a connection deteriorates the acoustic coupling between the metallic resonator and the piezoelectric disc, however, so that the capacity of the oscillator is limited and the mechanical losses of the motor are increased. Due to the influence of the ultrasonic energy on the adhesive there is the danger that the viscosity thereof changes, with the result that the oscillatory properties of the motor deteriorate. For the aforementioned reasons, so configured motors only have a limited mechanical performance, a short service life and thus altogether unsatisfying practical properties.

Likewise known are piezoelectric ultrasonic motors, the operating mode of which is based on the excitation of extensional waves traveling in a monolithic cylindrical piezoelectric resonator. Reference in this respect be, for example, made to U.S. Pat. No. 5,872,418.

As the whole resonator of such motors is made of a piezoelectric material problems due to different expansion coefficients will not occur. However, a drawback in view of the ultrasonic motors making use of extensional waves resides in the fact that all points of the oscillator have approximately the same oscillatory speed. This implies a uniform distribution of the energy stored in the oscillator over the entire volume, which causes unnecessary losses due to the internal friction of the points not being in the direct proximity of the friction surfaces of the oscillator. Moreover, there are no regions on the oscillator surface of such motors on which the oscillatory speed adopts zero values. This means that it is difficult to mount the oscillator of such a motor in a rigid manner with respect to a housing. An attachment is therefore accomplished by means of rubber-like elastic materials, which heat up due the ultrasonic influence, however. The same entails losses of energy and a heating up of the entire motor.

Moreover, the mechanical quality is reduced if the oscillating oscillator touches the elastic attachment, so that a higher excitation voltage is necessary. The required elastic flexibility of the fixing arrangement prevents the absolutely rigid fixation of the stator with respect to a housing and renders the phase characteristics of such motors more difficult, so that their use in systems for the purpose of fine and micro-positioning becomes more difficult and more cost-intensive.

On the basis of the above, it is therefore the object of the invention to provide an advanced method for operating a piezoelectric motor having a stator in the form of a hollow-cylindrical oscillator, the at least one front side of which has frictional contact with a rotor. Moreover, it is the object of the invention to provide a piezoelectric motor having a stator in the form of a hollow-cylindrical oscillator, wherein the losses of energy in both the oscillator and the fixing device of the oscillator or the motor, respectively, are to be kept small. According to the object, the excitation voltage for such motors is to be decreased, and an improved phase characteristic is to be provided.

With respect to the method the problem of the invention is overcome by the teaching according to patent claim 1, and with respect to the piezoelectric motor by the combination of features according to patent claim 3, with the dependent claims comprising at least useful embodiments and advancements.

The basic idea of the invention accordingly resides in the excitation of the hollow-cylindrical oscillator with a new type of an acoustic wave by setting the same in a coupled tangential-axial oscillation mode. The dimensions of the oscillator are selected and the excitation device is designed such that such a distribution of the oscillatory speeds of the acoustic wave is achieved on the circumference of the oscillator and along the height thereof, with which the oscillatory energy circulating in the oscillator is concentrated on the front sides of the oscillator being in frictional contact with the rotor and a nodal line with minimal oscillatory speeds extends in the center of the oscillator length or oscillator height, respectively. A rigid attachment, e.g. to a motor housing, can then be accomplished on this nodal line with minimal oscillatory speeds.

Thus, the piezoelectric ultrasonic motor to be provided is formed of a hollow-cylindrical oscillator with at least one front side being in frictional contact with a rotor. Moreover, the oscillator comprises generators of acoustic standing waves, wherein each of these generators is a generator of such acoustic standing waves which represent a coupled tangential-axial oscillation of the oscillator body, wherein the tangential and the axial oscillation component have a phase position of 0 or 180°, the tangential oscillatory speed maximums are located on the front sides of the oscillator and the axial oscillatory speed maximums extend slightly underneath these front sides of the oscillator. With an increasing distance from the front sides of the oscillator in an axial direction the two oscillatory speeds become increasingly smaller, with a nodal line extending in the center of the height of the hollow-cylindrical oscillator body and parallel to the front sides of the oscillator, on which the axial oscillatory speeds adopt the value zero and the tangential oscillatory speeds reach a minimum. Moreover, the oscillator body is alternately divided by axially extending nodal lines, in which the tangential or the axial oscillatory speeds are each equal to zero.

In other words, the hollow cylinder of the piezoelectric motor is set into a coupled tangential-axial oscillation mode, wherein the cylinder mainly has tangential and axial oscillation components. The excitation of the oscillator is effected such that the oscillatory speed maximums of the tangential components are formed on the front sides of the hollow cylinder, and those of the axial components underneath thereof, wherein—as was mentioned above—the components decrease towards the center of the cylinder height and a nodal line is formed in the center of the cylinder height substantially parallel to the front sides, on which the axial oscillation component adopts the value zero and the tangential components a minimum.

The excitation is accomplished with a frequency which corresponds to the oscillator resonance frequency and at which a standing wave of the coupled tangential-axial oscillation mode is formed.

As the acoustic wave excited in the oscillator of the motor according to the invention is one the oscillatory speed maximums of which are located on the front sides of the oscillator being in frictional contact with the rotor, while the oscillatory speed minimums extend in the middle part of the oscillator, the kinetic energy of the oscillator is concentrated in the proximity of the front sides of the oscillator, i.e. where it is required to drive the rotor.

By the above-described measures, the losses are reduced to a tolerable extent of the internal friction. By this, also the undesired heating of the hollow-cylindrical oscillator body is reduced.

Furthermore, it becomes possible—as was suggested already—to dispose a fixing device in the middle part of the oscillator, which does not load the oscillator, i.e. the hollow-cylindrical body. A mechanical resistance resulting in high energy losses is not caused by this fixing device. By this, the electrical voltage required to excite the oscillator may be reduced.

The piezoelectric motor according to the invention may be realized in various embodiments.

According to a first embodiment, the oscillator, i.e. the hollow-cylindrical body, is constructed as a monolithic piezoelectric body on the surface area of which one or more electrodes are provided.

Together with the common reference electrode disposed, for example, on the inner surface area and the piezoelectric ceramic disposed therebetween a generator of acoustic standing waves is formed.

Such a first embodiment of the motor according to the invention allows minimum dimensions.

According to a second embodiment, the oscillator may be formed as a monolithic, non-piezoelectric body. In this embodiment, the generators of acoustic standing waves are designed as rigid piezoelectric elements connected to the oscillator.

With such a modification motors with larger dimensions and larger capacities can be realized.

Another advantageous embodiment of the motor according to the invention resides in that the oscillator comprises two standing wave generators spatially displaced by a fourth of the wavelength.

The electrical excitation of the generators is then a two-phase one with a phase displacement by 90°. With this form of excitation a traveling wave is generated in the oscillator, and the rotor obtains a moving direction opposite to the traveling wave. With such a construction it is possible to provide two-phase traveling wave motors.

It is likewise possible to construct the piezoelectric motor according to the invention such that oscillator comprises three standing wave generators spatially displaced by a third of the wavelength.

The electrical excitation of the generators is then selected to have three phases with a phase displacement by 120°. In this way, too, is a traveling wave generated in the oscillator, and the rotor obtains a moving or, respectively, rotating direction opposite to traveling wave. This modification makes it possible to realize three-phase traveling wave motors.

Finally, it is possible to construct the motor according to the invention such that the oscillator comprises at least one group of like generators of acoustic standing waves. The generators are spatially displaced in opposite directions by half a wavelength and are connected to the electric source of excitation.

In this embodiment the height of the oscillator is selected such that also longitudinal oscillations of the oscillator occur simultaneously with the tangential-axial oscillator oscillation. The superposition of both oscillation forms causes the points located on the front sides of the oscillator to make straight movements inclined under an angle to the surface. By this, a piezoelectric standing wave motor can easily be provided.

The invention shall hereinafter be explained in more detail by means of embodiments and with reference to the figures. In the drawings:

FIG. 7 shows representations of the formation of the third oscillation mode;

Figure 1:
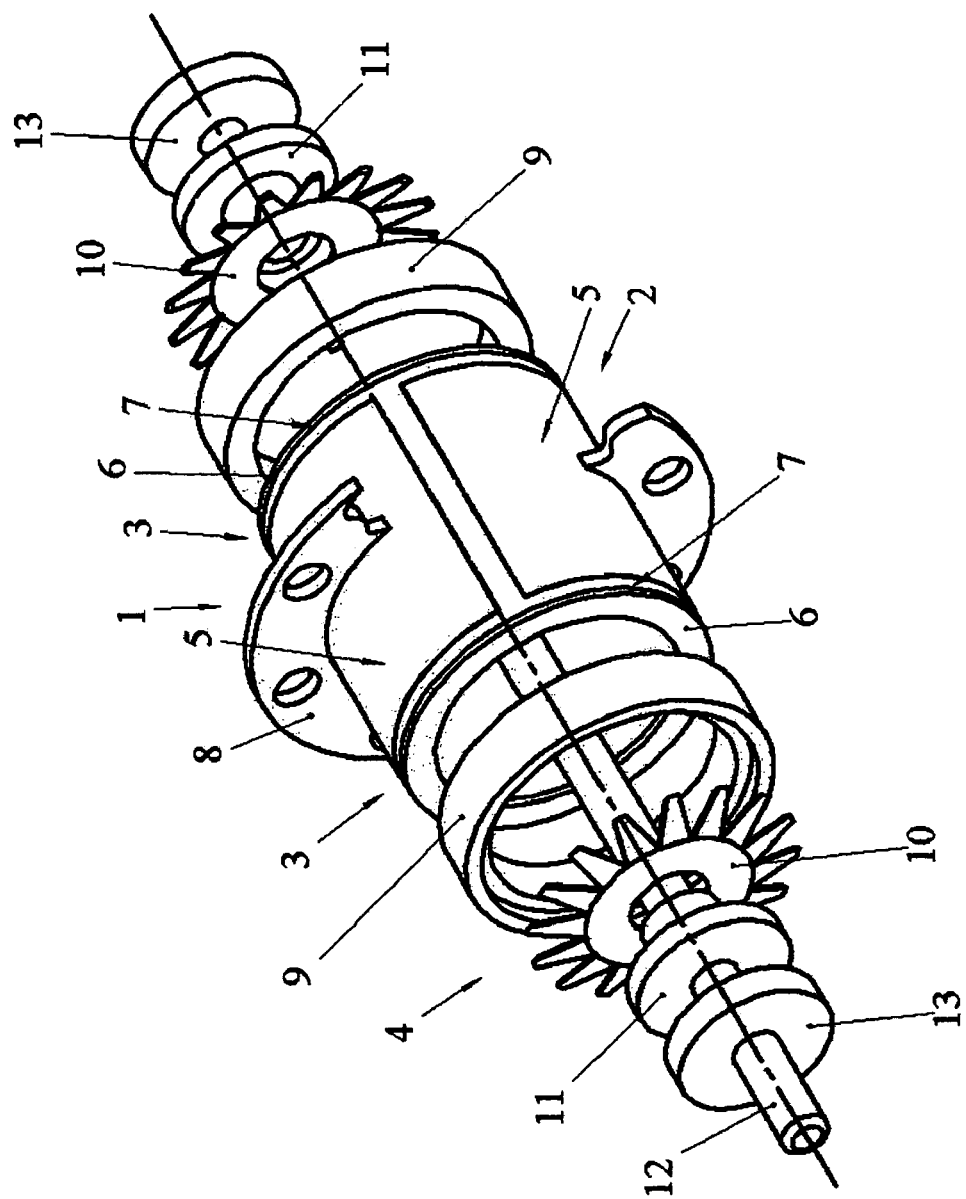
FIG. 1 shows an exploded view of an embodiment of a piezoelectric motor according to the invention comprising a hollow-cylindrical oscillator.

The piezoelectric ultrasonic motor shown in FIG. 1 comprises a stator 1 with at least one friction side 3 thereof being in frictional contact with the rotor 4.

The oscillator 2 comprises standing wave generators 5 as well as the respective friction layers 6 provided on the front sides 7 of the oscillator.

The attachment of the oscillator 2 with respect to a motor housing not illustrated is realized by means of a holding device 8.

The rotor 4 comprises friction discs 9 pressed against the oscillator 2 by means of elastic elements 10. These elastic elements 10 can, for example, be metallic spring members or synthetic springs formed in the nature of a disc spring.

The rotor 4 moreover comprises the centering bushes 11 and the bearing 13 arranged on the shaft 12.

Figure 2:
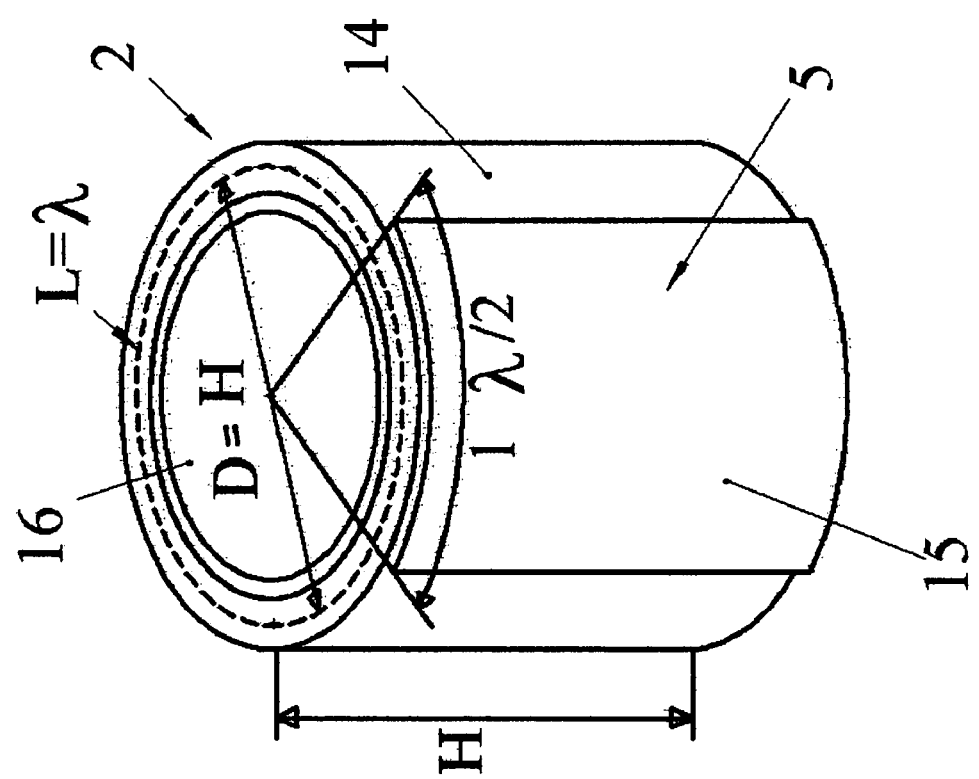
FIG. 2 shows an oscillator arrangement for exciting a first oscillation mode.

FIG. 2 shows an oscillator 2 of the motor according to the invention, which is constructed to be a monolithic, piezoelectric, radially polarized hollow-cylindrical body 14, with the diameter D of the circumferential center line L thereof being approximately equal to the height H and with the circumferential center line L being equal to the wavelength $\lambda$ excited on the circumference of the oscillator.

For reasons of comprehensibility, and for facilitating the illustration of the kind of excitation and the waveform, this oscillator is provided with one generator 5 only. The generator 5 is formed by the exciting electrode 15 located on the outer surface area, the common reference electrode 16 located on the inner surface area and by the area of the polarized piezoelectric ceramic disposed therebetween. The length of the exciting electrode 15 is usually equal to or smaller than half the wavelength $\lambda$.

Figure 3:
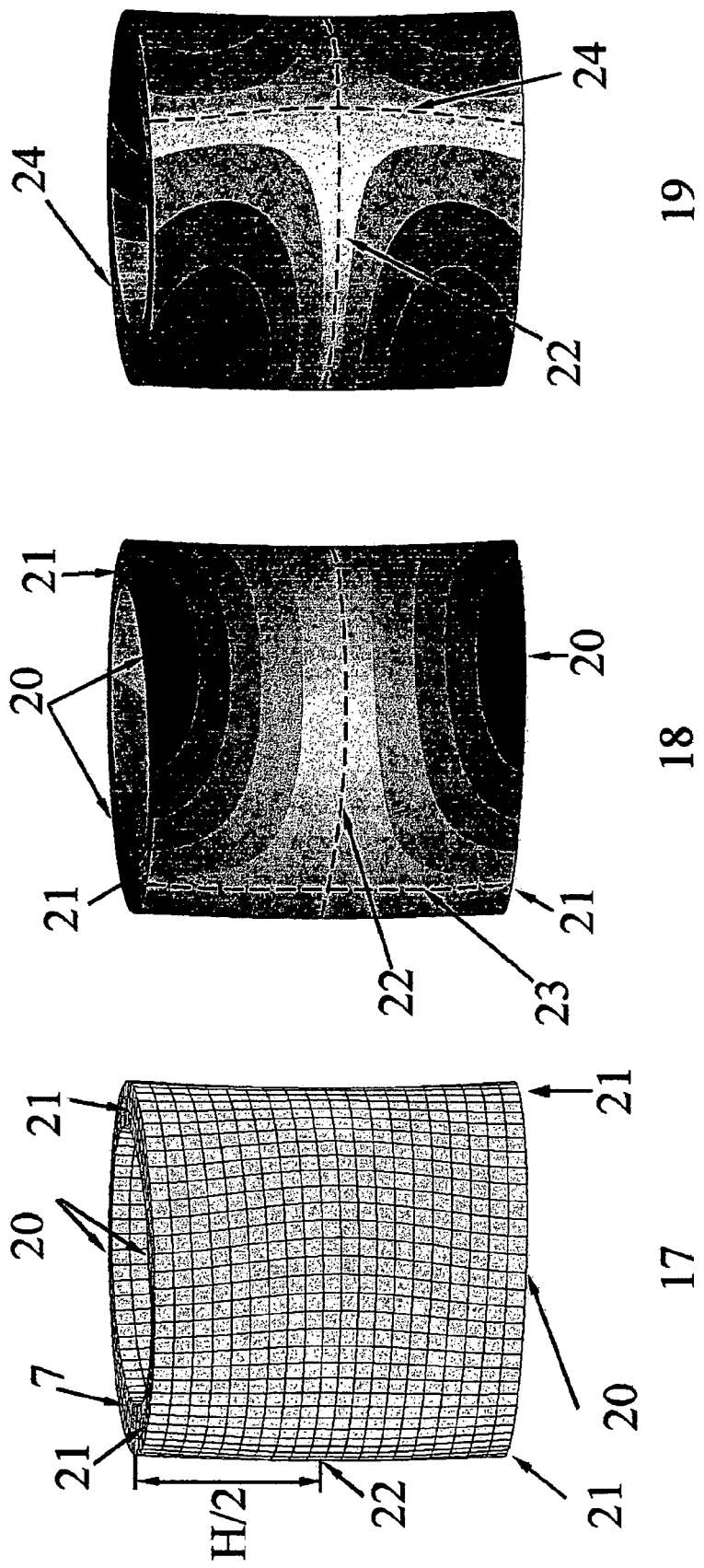
FIG. 3 shows representations of the first oscillation mode.

The deformation picture of the oscillator with the excitation of only one standing wave of the coupled tangential-axial oscillations by means of one generator 5 only is illustrated in FIG. 3, Position 17.

The circumferential center line L corresponds to the wavelength $\lambda$ of the wave excited in the oscillator, i.e. the first coupled tangential-axial oscillation mode is excited in the oscillator.

Positions 18 and 19 show the distribution of the tangential and axial oscillatory speeds for this case shown in Position 17.

When exciting the oscillator 2 of the first coupled tangential-axial oscillation mode, maximums 20 and minimums 21 of the tangential oscillatory speeds are alternately formed on the front sides 7 of the oscillator. Moreover, a nodal line 22 is formed on the surface areas of the oscillator, which is positioned approximately in the center of the oscillator height and extends parallel to the front surfaces. On this nodal line, the tangential oscillatory speeds adopt their minimum value and the axial oscillatory speeds adopt the zero value.

The surface areas of the oscillator 2 are moreover alternately divided by four axially extending nodal lines 23, 24 on which the tangential and axial oscillatory speeds adopt their zero value.

Figure 4:
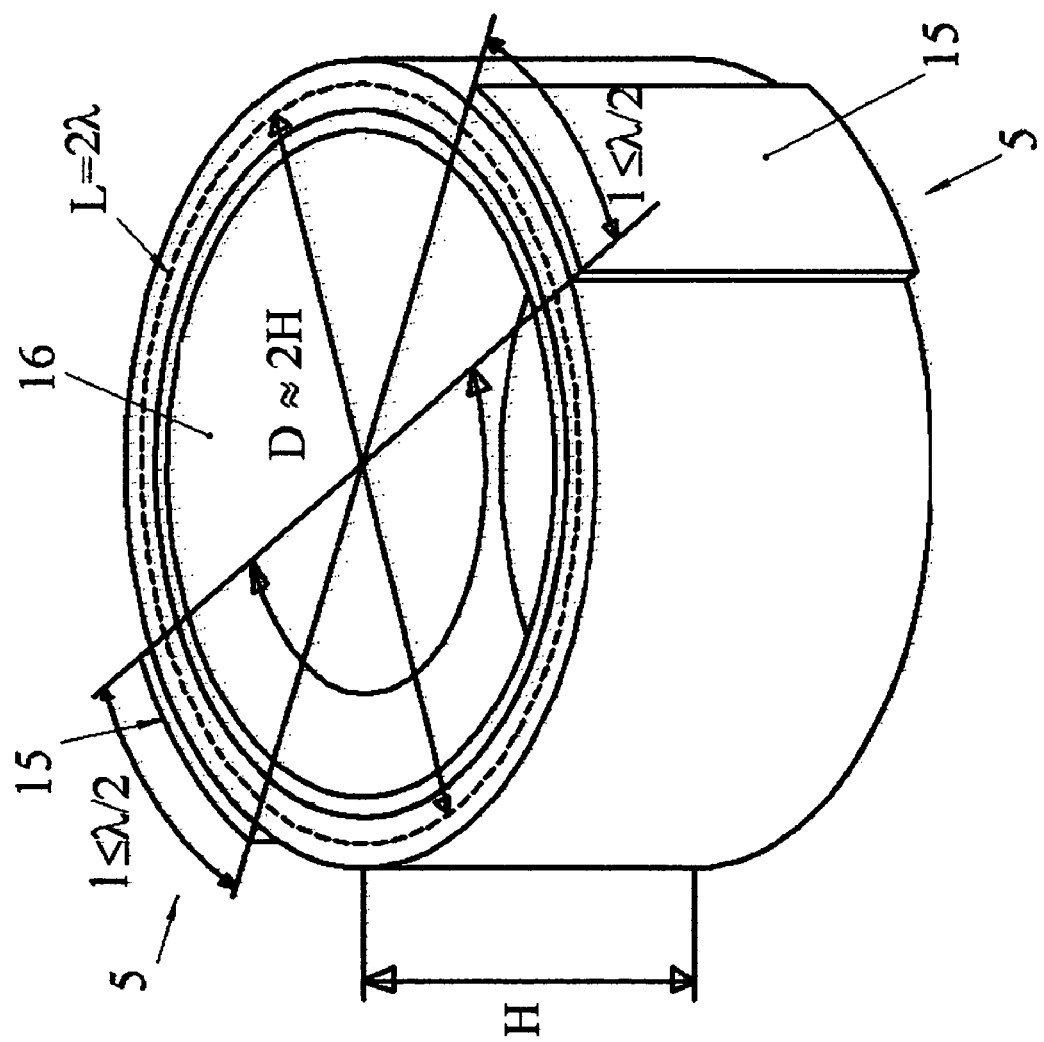
FIG. 4 shows an oscillator arrangement for exciting the second oscillation mode.

FIG. 4 illustrates an oscillator 2 of the motor as proposed, with the diameter D of the circumferential center line L thereof being approximately equal to 2H and with the circumferential center line L adopting the value $2\lambda$. This oscillator is equipped with two standing wave generators 5.

Figure 5:
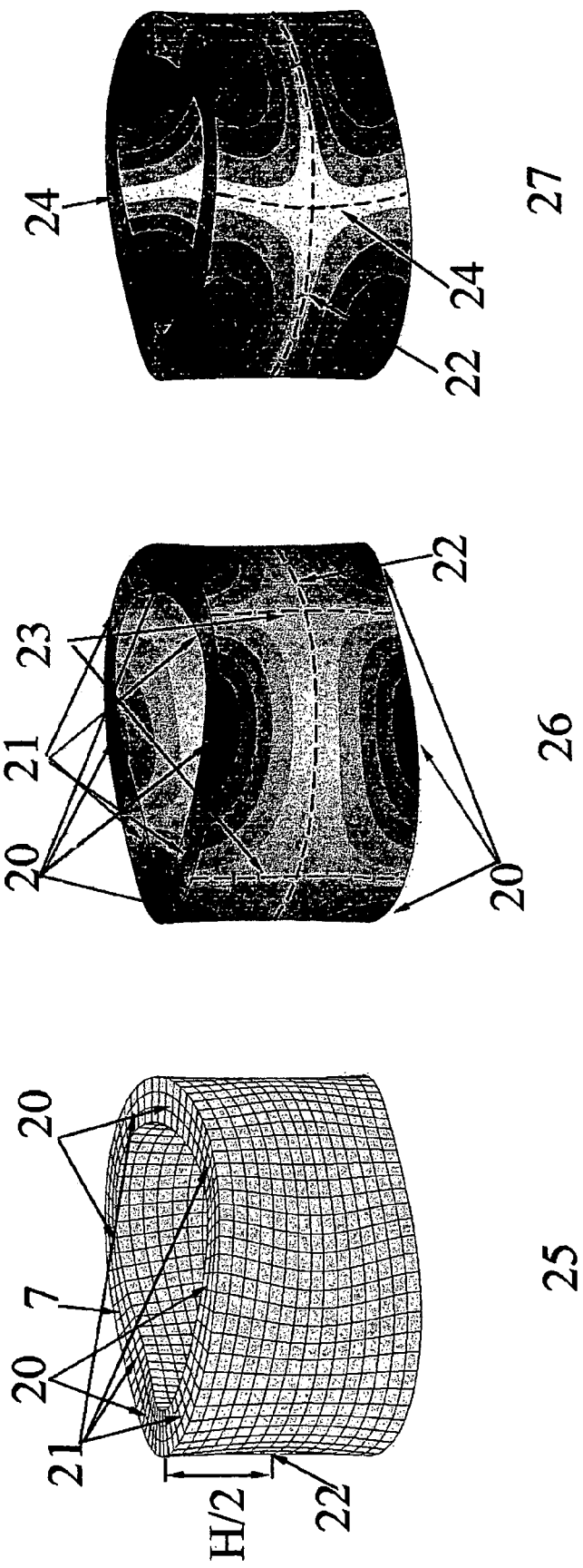
FIG. 5 shows representations of the course of the second oscillation mode.

FIG. 5, Position 25 now shows the deformation picture of the oscillator of FIG. 4 when only one standing wave of the coupled tangential-axial oscillations is excited by means of two generators 5. The circumferential center line L here is equal to $2\lambda$, i.e. the second coupled tangential-axial oscillation mode is excited in the oscillator.

Positions 26 and 27 show the distribution of the tangential and axial oscillatory speeds for this case.

Figure 6:
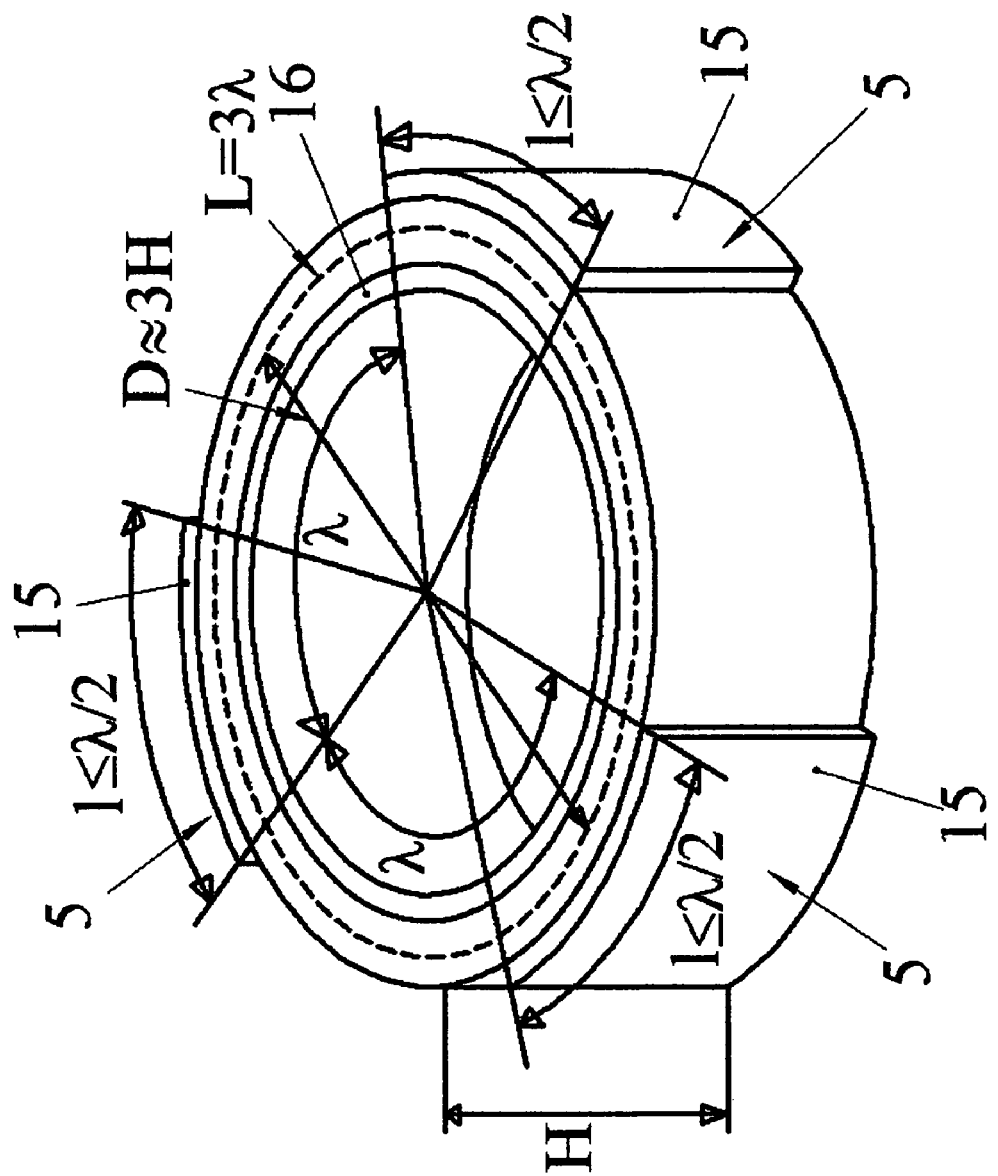
FIG. 6 shows an oscillator arrangement for exciting the third oscillation mode.

FIG. 6 relates to an oscillator 2 of the motor according to the invention, with the diameter D of the circumferential center line L thereof being approximately equal to 3H and with the circumferential center line L adopting the value $3\lambda$. This oscillator is equipped with three standing wave generators 5.

FIG. 7, Position 28 now demonstrates the deformation picture of the oscillator of FIG. 6 when only one standing wave of the coupled tangential-axial oscillations is excited by means of three generators 5. The circumferential center line L here is equal to $3\lambda$, i.e. the third coupled tangential-axial oscillation mode is excited in the oscillator.

Positions 29 and 30 show the distribution of the tangential and axial oscillatory speeds for this case. According to the same principle also higher modes may be excited by means of the oscillators.

Figure 8:
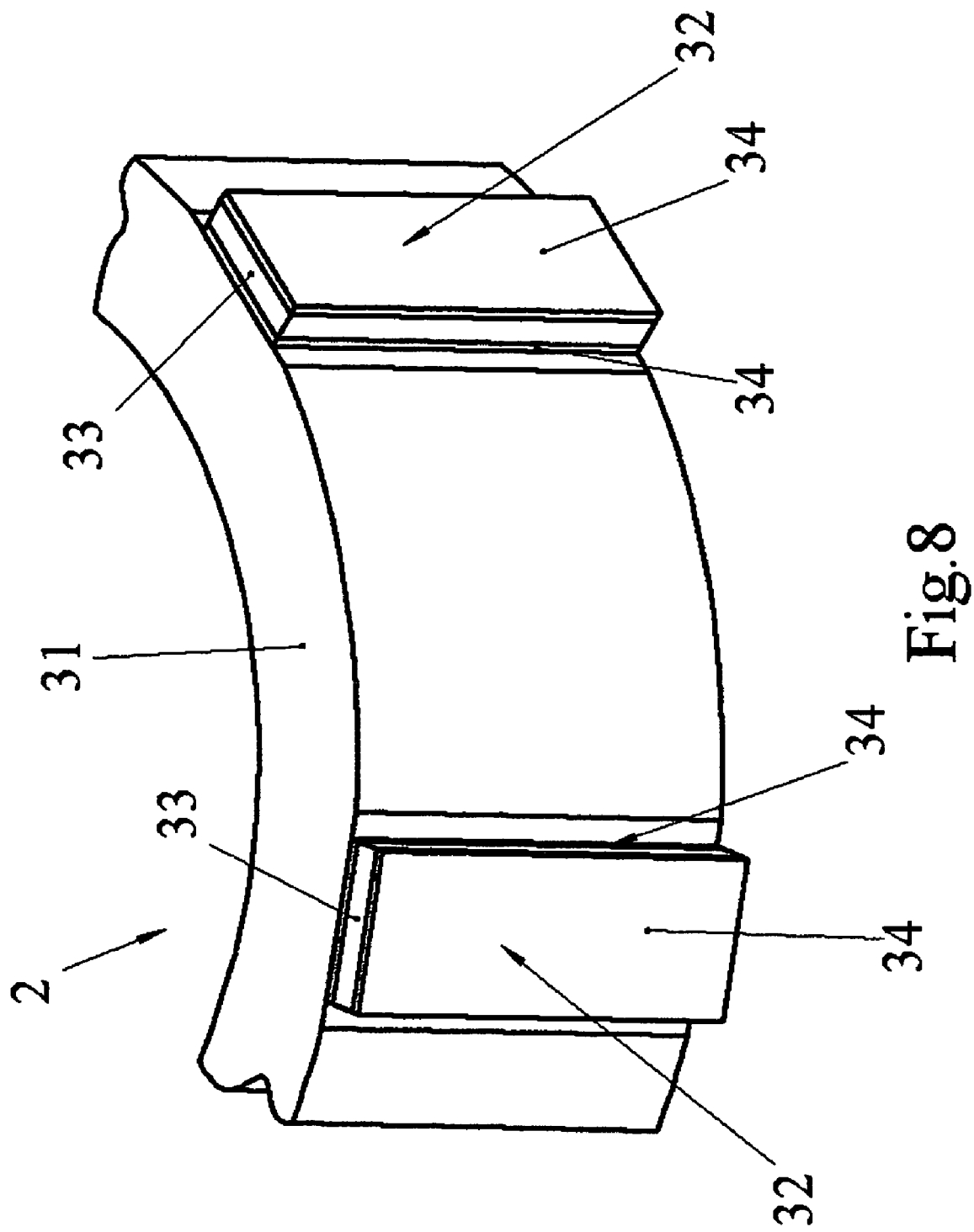
FIG. 8 shows a detailed representation of the oscillator from a non-piezoelectric body with piezoactuators disposed on the same.

According to the illustration shown in FIG. 8, the oscillator 2 is constructed as a non-piezoelectric body 31 made, for example, of metal, ceramic, glass or a similar material. This body 31 comprises piezoelectric elements 32 rigidly connected thereto. The piezoelectric elements 32 may be designed as piezoelectric plates 33 with electrodes 34, or may have another design.

Figure 9:
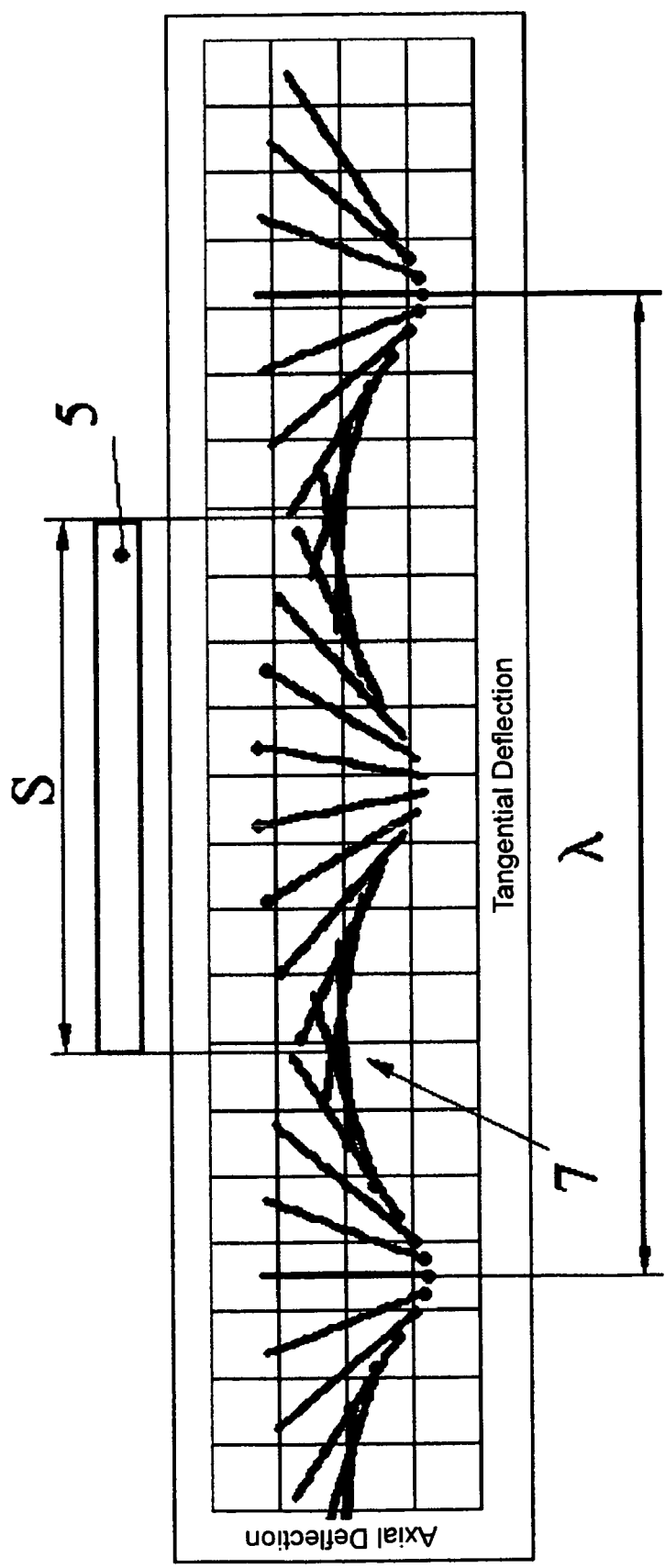
FIG. 9 shows a course of the movement paths of points located on the front sides of the oscillator with the excitation of a standing wave.

FIG. 9 serves to explain the movement paths of points on the front sides 7 of the oscillator when the coupled tangential-axial oscillation mode is excited. The dimension S thereby specifies the area where the generator 5 is disposed.

Figure 10:
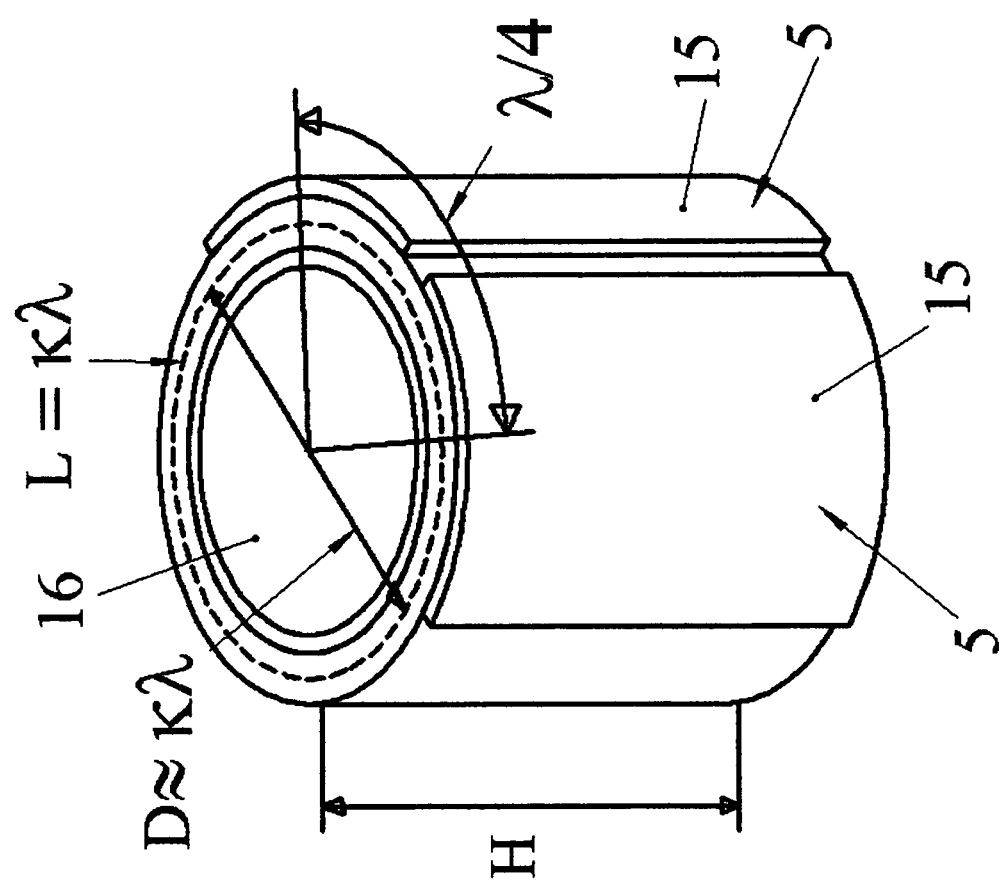
FIG. 10 shows an oscillator construction for a two-phase motor.

FIG. 10 discloses a modification of the oscillator 2 of a two-phase traveling wave motor with the use of the coupled tangential-axial oscillation mode. This oscillator comprises at least two generators 5 spatially offset with respect to each other by $\lambda/4$ of the excited wavelength.

For operating such a motor the electrical excitation of the generators 5 is accomplished with a phase displacement by 90°, whereby a traveling wave of the coupled tangential-axial oscillation is generated in the oscillator 2. With correspondingly altered constructive variants of the motor the oscillator 2 may be equipped with several pairs of generators 5 which are offset with respect to each other by $\lambda/4$ and are parallel connected. The length of the circumferential center line L thereby is an integral multiple of $\lambda$, i.e. $L=k\lambda$ with k=the number of generator pairs 5.

Figure 11:
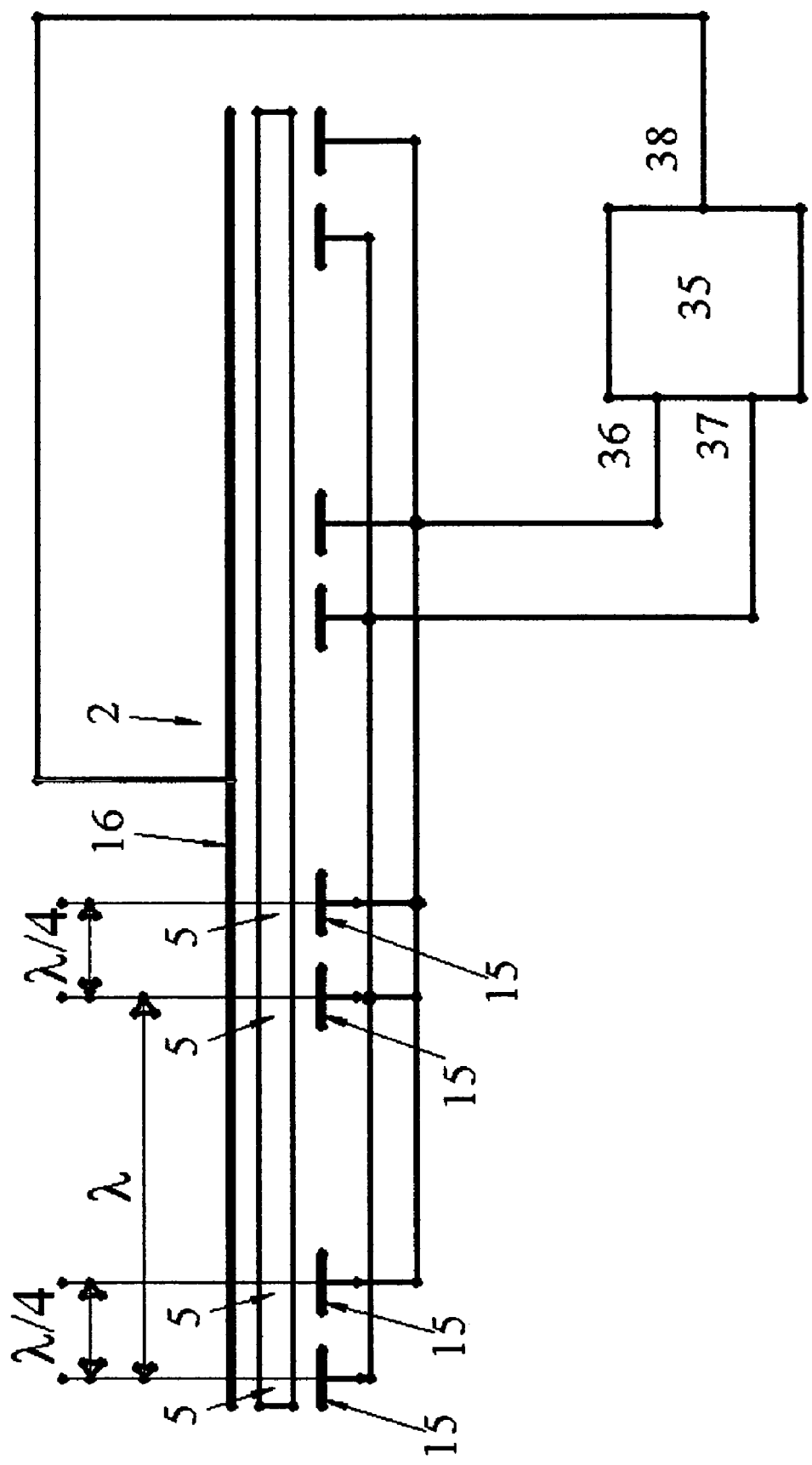
FIG. 11 shows an exemplary electrical connection for a two-phase motor.

The connection of a two-phase oscillator 2 to a two-phase exciting source 35 is shown in FIG. 11. The source 35 comprises two outputs 36 and 37 connected to the electrode 15 to be excited of the generator 5. The source 35 moreover comprises a common output 38 connected to the common reference electrode 16. The source 35 provides for two electrical voltages in quadrature.

Figure 12:
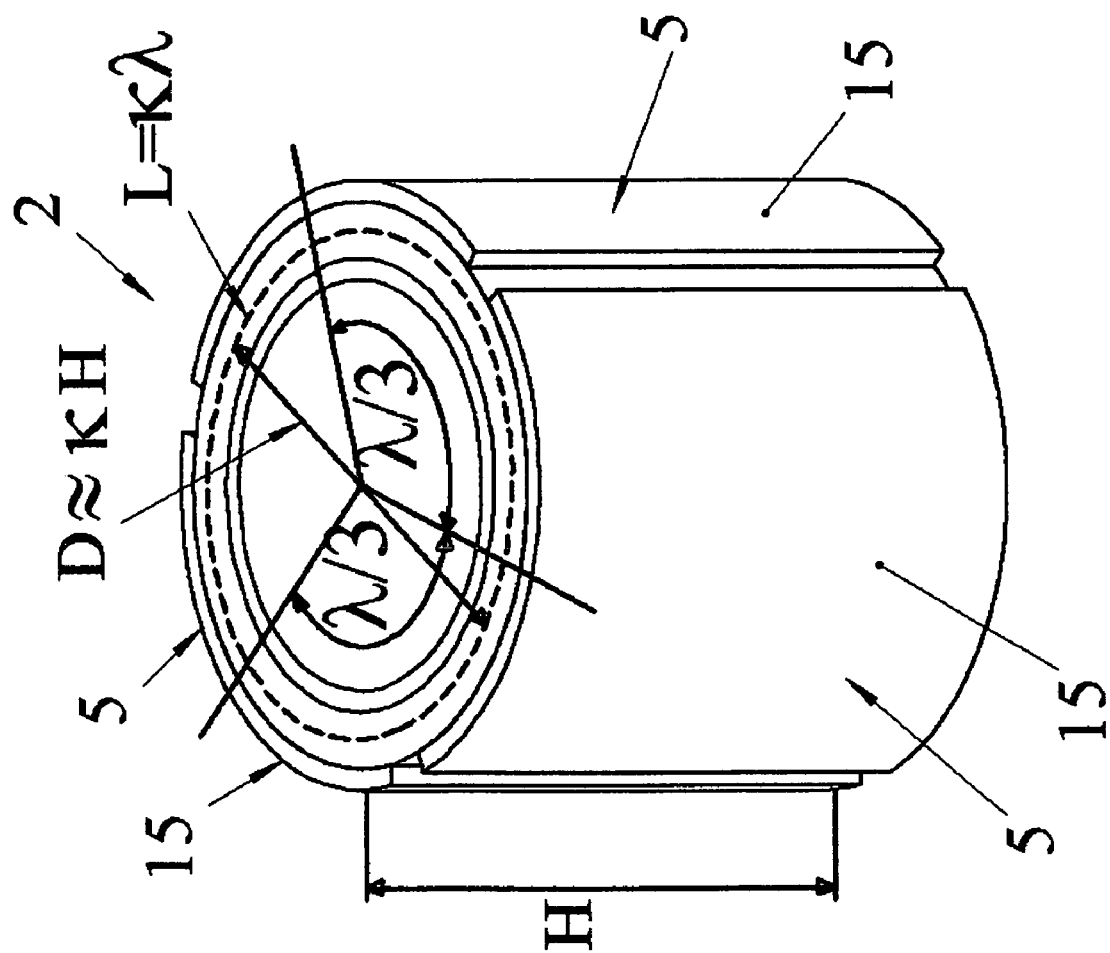
FIG. 12 shows an embodiment of an oscillator for a three-phase motor.

FIG. 12 shows a modification of an oscillator 2 of a three-phase traveling wave motor with the use of the coupled tangential-axial oscillation mode.

This oscillator is equipped with at least three generators 5 spatially offset with respect to each other by $\lambda/3$ of the excited wavelength. The electrical excitation of the generators 5 has a phase displacement by 120° whereby a traveling wave is generated in the oscillator 2. With different constructional modifications of the motor the oscillator 2 may be equipped with several pairs of generators 5 each being offset with respect to each other by $\lambda/3$ and parallel connected.

Figure 13:
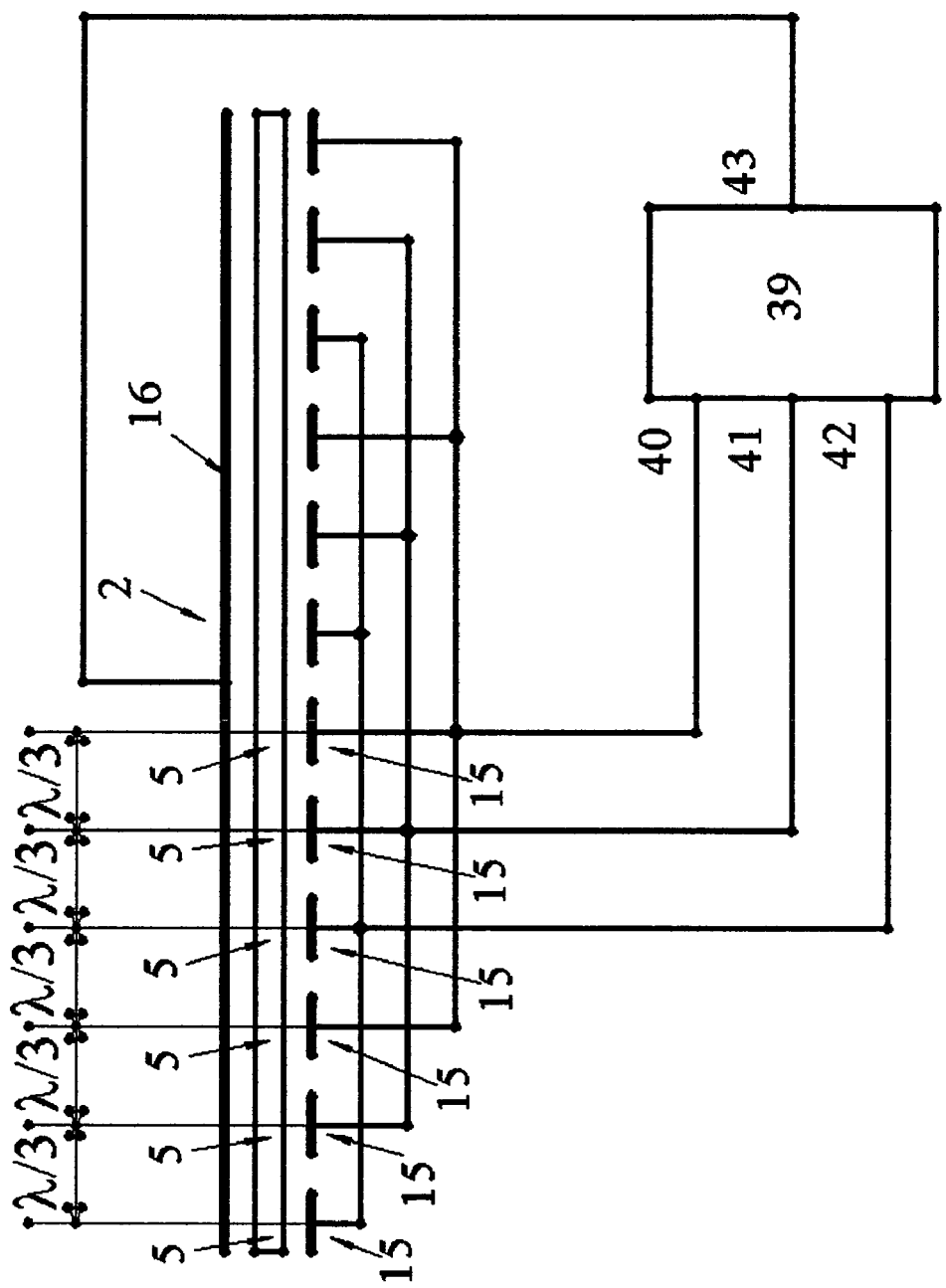
FIG. 13 shows an exemplary electrical connection for a three-phase motor.

The circuitry according to FIG. 13 serves to control a three-phase oscillator 2 with a three-phase exciting source 39.

The source 39 has three outputs 40, 41 and 42 which are connected to the exciting electrode 15 of the generator 5 and moreover comprises a common output 43 being in contact with the reference electrode 16. The exciting source provides for three electrical voltages phase-displaced by 120°.

Figure 14:
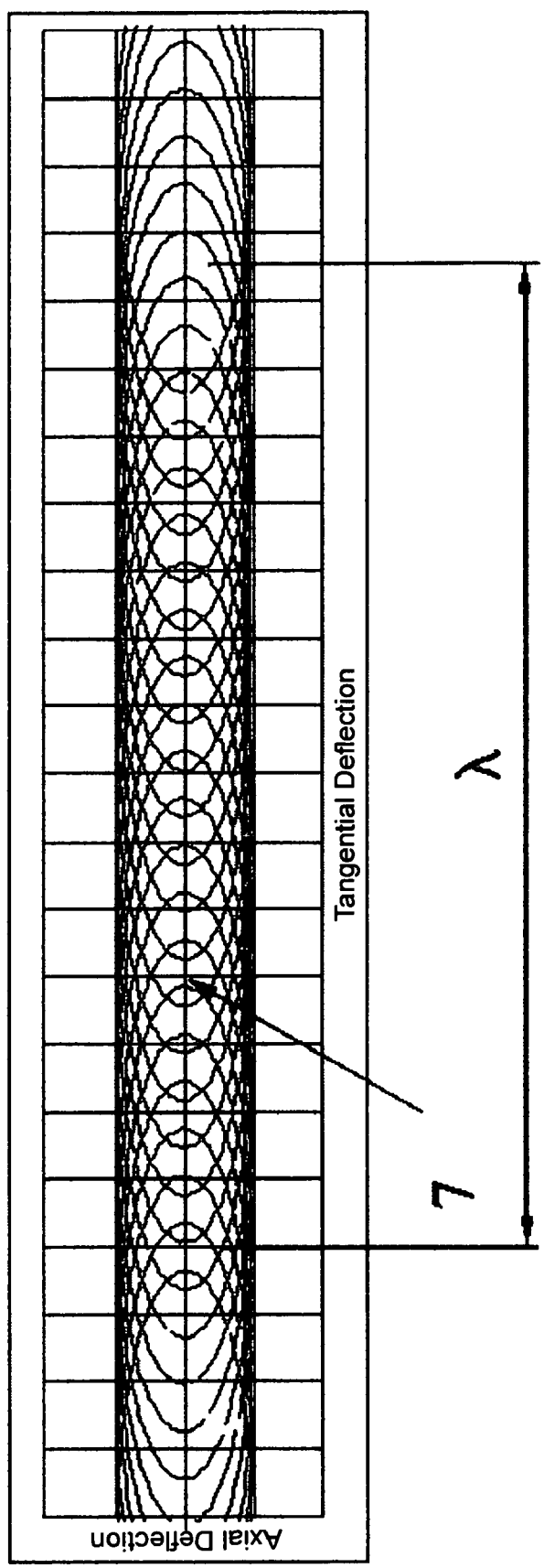
FIG. 14 shows movement paths of the points located on the front sides of the oscillator with the excitation of a traveling wave.

Elliptical movement paths of the oscillator surface 7 with the excitation of a traveling wave of the coupled tangential-axial oscillations is shown in FIG. 14.

Figure 15:
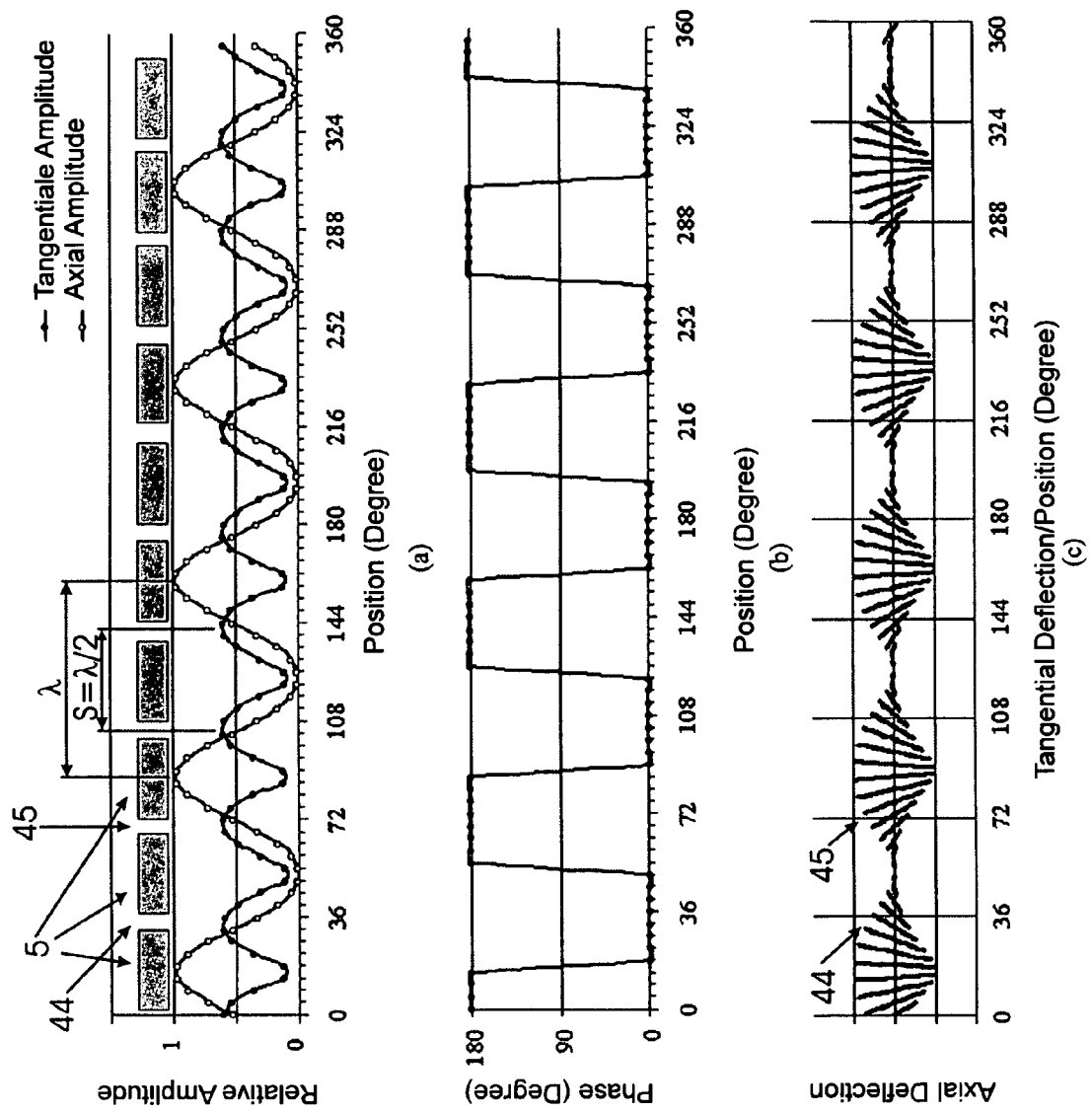
FIG. 15 shows (a) the course of tangential and axial oscillatory speeds on the front side of the oscillator; (b) the phase position between tangential and axial oscillation deflections; (c) movement paths of the points located on the front sides of the oscillator with the simultaneous excitation of tangential-axial oscillations and longitudinal oscillations.

FIG. 15 represents movement paths of the oscillator surface 7 with the simultaneous excitation of a standing wave of the coupled tangential-axial oscillations and the longitudinal oscillations of the oscillator.

In this modified embodiment of the oscillator 2 areas 44 and 45 are provided on the surfaces 7 of the oscillator on which the tangential and the axial oscillatory speed components are approximately equal, their phase displacement is 0 or 180° and the movement paths of the points are aligned under an angle to the surface 7.

Figure 16:
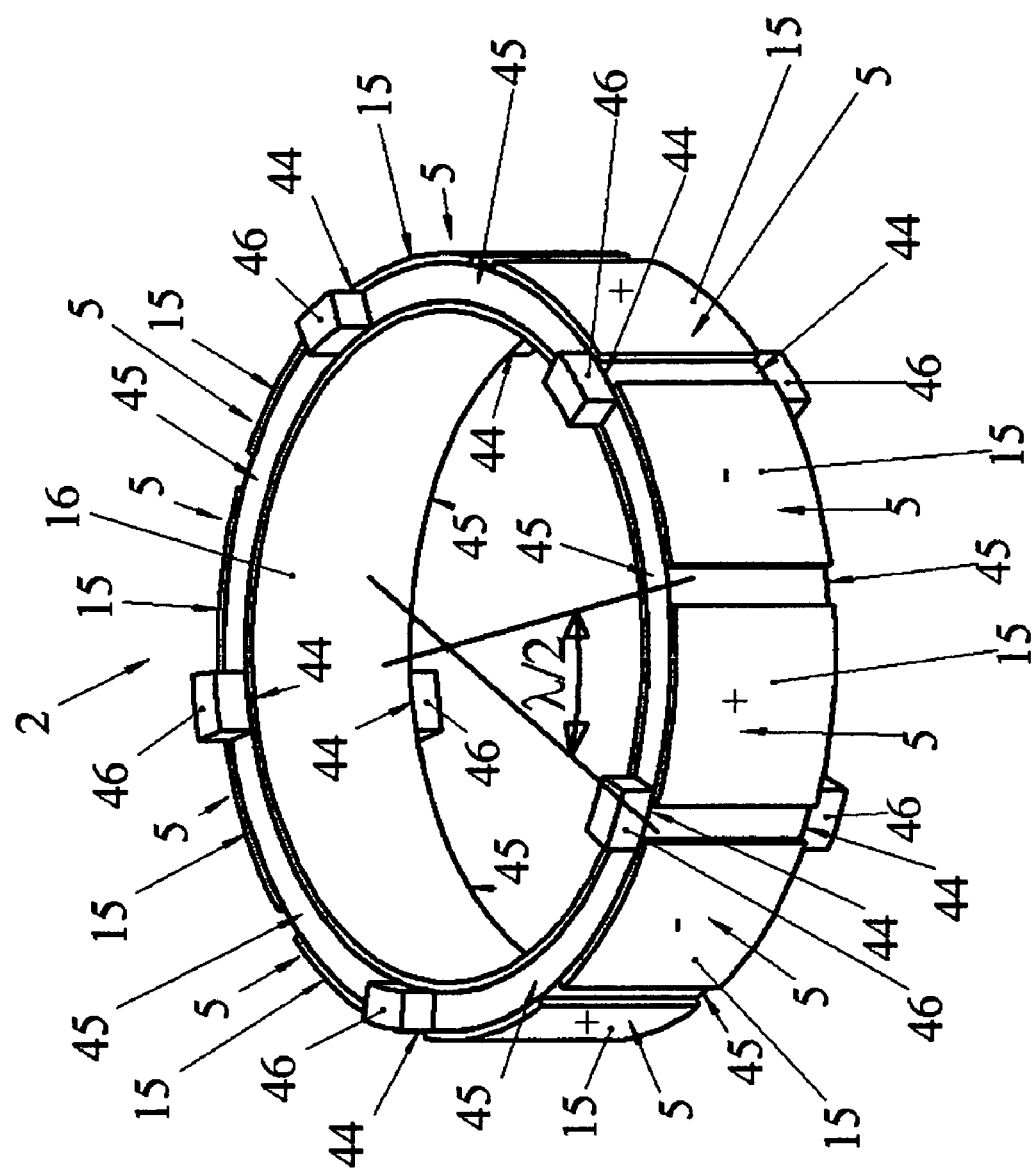
FIG. 16 shows an embodiment of the oscillator for a single-phase motor.

FIG. 16 shows an oscillator 2 of a single-phase modification of the embodiment of the motor according to the invention, with the use of standing waves of the coupled tangential-axial oscillations, with five active generators 5 and five friction elements 46 arranged in areas 44 or 45 on the surfaces 7 thereof.

Figure 17:
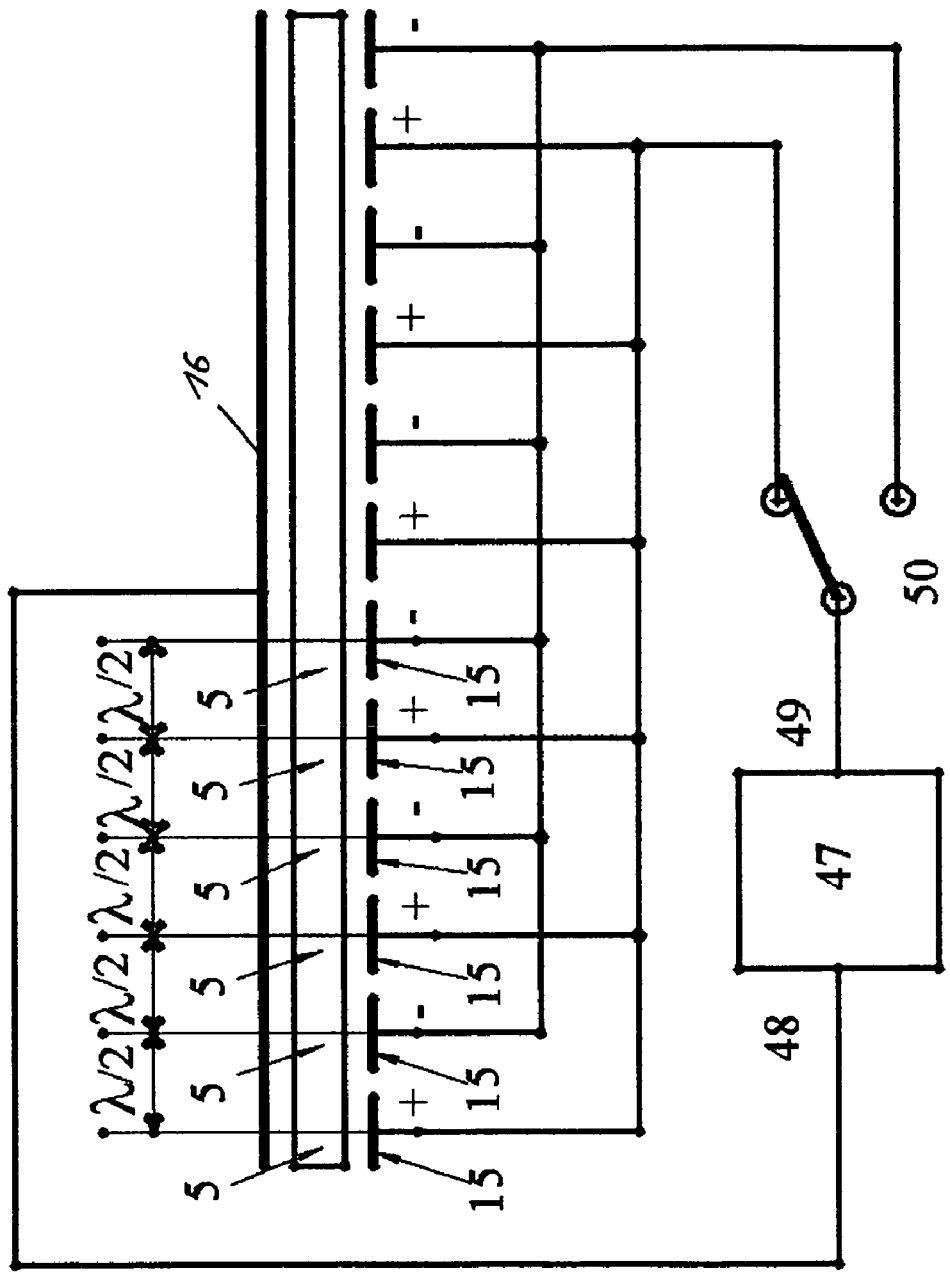
FIG. 17 shows an exemplary electrical connection for a single-phase motor.

A corresponding electrical connection of such a single-phase motor of FIG. 16 is shown in FIG. 17. The exciting source 47 comprises an output 48 connected to the reference electrode 16. The output 49 is connected to the electrodes 15 of the active generators by means of a change-over switch 50. The source 47 provides for a single-phase electrical voltage at the output 49.

The piezoelectric motor illustrated in FIG. 1 operates as follows. When starting the motor, the exciting sources 35, 39 or 47 generate an electrical voltage with the frequency that corresponds to the resonance frequency $F_0$ of the oscillator 2 and at which a standing wave of the coupled tangential-axial oscillation mode can be excited in the oscillator.

The resonance frequency $F_0$ of this oscillation mode of the oscillator can approximately be determined in accordance with the relation $F_0=N/H$, with N being a material- and wall thickness-dependent frequency constant.

With an oscillator 2 having an outer diameter of 20 mm, an inner diameter of 15 mm and a height of 20 mm, formed of a piezoelectric ceramic PIC 181 of the company PI Keramik GmbH, N=188,000 Hz·cm.

When applying an electrical voltage to the electrodes 15, 16 of the generator 5 a standing wave of the coupled tangential-axial oscillation mode is excited in the oscillator 2. Regardless of the respectively selected frequency a first, second, third and so on oscillation mode can thereby by excited, so that one, two, three and so on wavelengths are located on the circumference of the oscillator 2 (see FIG. 2, 4 or 6).

Deformation pictures of such an oscillator with the excitation of the first, second and third coupled tangential-axial oscillation modes are shown in FIGS. 3, 5 and 7.

The coupled tangential-axial oscillation mode of a hollow cylinder is characterized in that the oscillation of the cylinder mainly has tangential and axial oscillation components, which moreover have a phase displacement of 0 or 180°. Oscillatory speed maximums of tangential oscillation components are located on the front side 7 of the oscillator while those of the axial component are slightly underneath the same.

With an increasing distance from the front sides 7 of the oscillator in an axial direction both components become smaller with respect to their values. In the center of the cylinder height H a nodal line 22 extends parallel to the front sides 7 of the oscillator, on which the axial oscillatory speed component adopts the zero value and the tangential oscillatory speed reaches a minimum. The oscillator body 2 is alternately divided by axially extending nodal lines 23 and 24 in each of which the tangential or the axial oscillatory speed reaches the zero value.

FIG. 9 shows movement paths of the points located on the front surfaces 7 on the circumference of the oscillator when the coupled tangential-axial oscillation mode in the oscillator 2 is excited. In oscillator 2 it is possible to excite two, three or more standing waves simultaneously and independently of each other. By the superposition thereof a traveling wave can then be generated. For generating a traveling wave by means of two standing waves the oscillator 2 of the motor as proposed is provided with at least two generators 5 spatially offset with respect to each other by one fourth of the wavelength (see FIG. 10). The generators are then supplied with two exciting voltages in quadrature.

For generating a traveling wave by means of three standing waves the oscillator 2 of the motor according to the invention is provided with at least three generators 5 spatially offset with respect to each other by one third of the wavelength (see FIG. 12). In this case, the generators are supplied with two exciting voltages the phase displacement of which is 120°.

In both cases, the points located on the front sides of the oscillator 2 travel through the same elliptical paths illustrated in FIG. 14. Due to the elliptical movement of the points located on the front surfaces of the oscillator 2 the rotor 4 is supplied with a torque.

According to another advantageous modification of the motor, the oscillator 2 is equipped with at least one like group of generators 5. Like generators 5 mean that the same deformation of the oscillator is caused when they are supplied with an equiphase electrical voltage. With such a modification of the embodiment of the motor, the height H of the oscillator 2 is selected such that, simultaneously with the coupled tangential-axial oscillation mode, also a longitudinal oscillation mode is excited in the oscillator. A simultaneous excitation of both modes is possible only if the geometric dimensions of the oscillator are selected such that the resonance frequencies of both oscillation modes are proximate to each other.

The superposition of both oscillation modes results in the movement of the points located on the front surfaces 7 of the oscillator 2 along straight lines. The angle of inclination of this straight line to the surface is determined by the tangential and axial oscillation amplitudes in the respective surface point. FIG. 15(a) to (c) show the course of tangential and axial oscillatory speeds on the front side of the oscillator, their mutual phase position as well as the paths of movement of the surface points.

It can be seen in FIG. 15 that areas 44 and 45 are provided at the edges of the generators 5 which have approximately the same tangential and axial oscillation component with a phase difference of 0 or 180°. In other words, the movement paths of the points are aligned under an angle of approximately 45° to the surface 7. With this constructional modification of the motor the friction elements 46 on the surface 7 are only arranged in the areas 44 or only in the areas 45 (see FIG. 16).

By controlling one group of the exciting generators the stator is excited. The rotor pressed against the pushing elements undergoes a rotational movement due to the micro-pushes generated by the pushing elements. By controlling another group of generators the mode or the standing wave, respectively, underneath the pushing elements is excited with a displacement by half a wavelength $\lambda/2$. By this, the phase of the tangential deflections of the pushing elements is changed. Their movement paths change direction, and the rotor undergoes an opposite rotational movement.

The circuitry depicted in FIG. 17 shows an electrical connection of the above-described modified motor. The circuit is provided with the change-over switch 50 which optionally connects the output 49 of the source 47 with the generators 5 located on the left or the right of the friction elements. By this, the direction of movement of the rotor may be switched over.

The cylindrical oscillator of the described piezoelectric ultrasonic motor according to the invention has the maximums of the tangential oscillatory speeds on its front surface and the maximums of the axial oscillatory speeds slightly underneath the same, i.e. where also the rotor is pressed on.

At the same time, both oscillatory speeds or the components thereof, respectively, disappear in the center of the oscillator height. This means that such a motor has losses being smaller by the factor 2 with respect to the internal friction than devices making use of extensional waves. The formation of a range of minimum oscillation amplitudes in the center of the oscillator height allows the arrangement of a fixing device without additional losses occurring thereby. This loss-free mounting of the oscillator improves the mechanical quality, so that the exciting voltage of the motor may be reduced. With such a mounting also the elastic devices becoming necessary otherwise may be omitted, so that the phase characteristic of the motor is improved.

LIST OF REFERENCE NUMERALS 1 stator
2 oscillator
3 front sides of oscillator
4 rotor
5 generators
6 friction layer
7 front surfaces of oscillator
8 fixing device
9 friction discs
10 elastic elements
11 centering bushes
12 shaft
13 bearing
14 monolithic piezoelectric oscillator
15 exciting electrode
16 reference electrode
17 deformation picture of the oscillator
18 representation of the distribution of tangential oscillatory speeds
19 representation of the distribution of axial oscillatory speeds
20 maximum of tangential oscillatory speeds
21 minimum of tangential oscillatory speeds
22 nodal line
23 zero lines of tangential oscillatory speeds
24 zero lines of axial oscillatory speeds
25 deformation picture of the oscillator
26 representation of the distribution of tangential oscillatory speeds
27 representation of the distribution of axial oscillatory speeds
28 deformation picture of the oscillator
29 representation of the distribution of tangential oscillatory speeds
30 representation of the distribution of axial oscillatory speeds
31 non-piezoelectric body of the oscillator
32 piezoelectric element
33 piezoelectric plates
34 electrode on piezoelectric element
35 two-phase exciting source
36 to
38 outputs of source 35
39 three-phase exciting source of the oscillator
40 to
43 outputs of source 39
44 to
45 areas of surface 7
46 friction elements
47 single-phase exciting source of the oscillator
48 to
49 outputs of source 47
50 change-over switch

The invention claimed is:

1. A method for operating a piezoelectric motor having a stator in a form of a hollow-cylindrical oscillator, at least one front side of which has frictional contact with a rotor and which includes standing wave generators, the method comprising:
setting the hollow cylinder into a coupled tangential-axial oscillation mode so that tangential and axial oscillatory speed components of the standing wave thus formed in the oscillator or, respectively, points of the cylinder have a same phase or a phase difference of 180°;
forming oscillatory speed maximums of the tangential component on the front sides of the hollow cylinder and those of an axial component underneath thereof, wherein, towards a center of the cylinder height, parallel to the front sides of the cylinder, a nodal line is formed on which the axial oscillatory speed component adopts the value zero and the tangential component adopts a minimum, and wherein further axially extending nodal lines are formed in the hollow-cylindrical body in dependence on the mode order on which the axial or tangential oscillatory speed components adopt zero values.

2. A method according to claim 1, wherein the standing wave generators are excited with a frequency that corresponds to the oscillator resonance frequency and at which a standing wave of the coupled tangential-axial oscillation mode is formed.

3. A piezoelectric motor having a stator in a form of a hollow-cylindrical oscillator, at least one front side of which has frictional contact with a rotor, comprising:
standing wave generators configured to generate coupled tangential-axial oscillations in the hollow-cylindrical oscillator, wherein tangential and oscillatory speed components have a same phase position or a phase difference of 180°, the tangential oscillatory speed maximums are located on the front sides and the axial oscillatory speed maximums underneath the front sides, and wherein the same decrease towards half a height of the hollow cylinder so that kinetic drive energy for a rotor is concentrated in proximity of the front sides of the hollow cylinder, and wherein further a mechanical attachment for the motor is arranged or provided in the central portion on the zero line of the values of the components.

4. A piezoelectric motor according to claim 3, wherein the hollow-cylindrical oscillator comprises a monolithic piezoelectric body on a first surface area of which one or more electrodes are provided and on a second surface area of which a common reference electrode is provided, both forming generators of standing waves together with piezo-electric ceramic disposed therebetween.

5. A piezoelectric motor according to claim 3, wherein the hollow-cylindrical oscillator comprises a monolithic non-piezoelectric body, wherein the generators are constructed as piezoelectric elements rigidly connected to the hollow cylinder with corresponding electrodes.

6. A piezoelectric motor according to claim 3, wherein the oscillator comprises two standing wave generators spatially displaced by one fourth of the wavelength, electrical excitation of which has a phase quadrature by which a traveling wave is generated in the oscillator and the rotor has a moving direction opposite to the traveling wave.

7. A piezoelectric motor according to claim 3, wherein the oscillator comprises three standing wave generators spatially displaced by one third of the wavelength, electrical excitation of which has a phase displacement by 120° by which a traveling wave is generated in the oscillator and the rotor has a moving direction opposite to the traveling wave.

8. A piezoelectric motor according to claim 3, wherein the oscillator comprises at least one group of like generators of acoustic standing waves displaced against each other by half a wavelength and connected to an electrical exciting source, wherein the oscillator height is selected such that a longitudinal mode is excited simultaneously with the tangential-axial mode, wherein superposition of both modes causes points located on the front sides of the hollow cylinder to perform elliptical or straight movements.

9. A piezoelectric motor according to claim 3, wherein the hollow-cylindrical oscillator body has a conical shape on front insides thereof so as to guide and mount the rotor in a self-centering manner, which has a counter-conically shaped section at its respective ends.

10. A piezoelectric motor according to claim 3, wherein the standing wave generators are excited with a frequency that corresponds to the oscillator resonance frequency and at which a standing wave of the coupled tangential-axial oscillation mode is formed.

11. A piezoelectric motor according to claim 3, wherein a mechanical attachment for the stator is arranged or provided in the central portion of the hollow cylinder on the nodal line extending parallel to the front sides.

\* \* \* \* \*